United States Patent
Kodama

Patent Number: 6,137,149
Date of Patent: *Oct. 24, 2000

[54] SEMICONDUCTOR DEVICE HAVING RAISED SOURCE-DRAINS AND METHOD OF FABRICATING THE SAME

[75] Inventor: Noriyuki Kodama, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/883,818

[22] Filed: Jun. 27, 1997

[30] Foreign Application Priority Data

Jun. 27, 1996 [JP] Japan .................................. 8-167681

[51] Int. Cl.$^7$ .......................... H01L 29/76; H01L 29/94; H01L 31/062; H01L 31/113

[52] U.S. Cl. .......................... 257/408; 257/382; 257/397; 257/411

[58] Field of Search .......................... 257/408–411, 397, 257/382, 383–336; 438/297, 230, 152, 158, 300–305

[56] References Cited

U.S. PATENT DOCUMENTS

| | | | |
|---|---|---|---|
| 4,951,100 | 8/1990 | Parrillo | 257/382 |
| 5,198,378 | 3/1993 | Rodder et al. | 438/297 |
| 5,213,990 | 5/1993 | Rodder | 438/152 |
| 5,214,295 | 5/1993 | Manning | 438/158 |
| 5,397,909 | 3/1995 | Moslehi | 257/383 |
| 5,518,945 | 5/1996 | Bracchitta et al. | 438/975 |
| 5,545,579 | 8/1996 | Liang et al. | 438/297 |
| 5,576,228 | 11/1996 | Chen et al. | 438/305 |
| 5,650,347 | 7/1997 | Choi | 438/305 |
| 5,670,804 | 9/1997 | Usagawa et al. | 257/900 |
| 5,679,589 | 10/1997 | Lee et al. | 438/305 |
| 5,716,861 | 2/1998 | Moslehi | 438/305 |

FOREIGN PATENT DOCUMENTS

| | | |
|---|---|---|
| 3-166735 | 7/1991 | Japan . |
| 6-204473 | 7/1994 | Japan . |
| 7-022338 | 1/1995 | Japan . |
| 8-167718 | 6/1996 | Japan . |

*Primary Examiner*—Minh Loan Tran
*Assistant Examiner*—Cuong Quang Nguyen

[57] ABSTRACT

There is provided a semiconductor device including (a) a semiconductor substrate, (b) a gate insulating film formed on the semiconductor substrate, (c) a gate electrode formed on the gate insulating film, (d) L-shaped insulating films each comprising a first portion vertically extending on a sidewall of the gate electrode, and a second portion horizontally extending on the semiconductor substrate, and (e) raised source and drain layers formed on the semiconductor substrate in selected areas so that the raised source and drain layers make contact only with an end surface of the second portion. In the semiconductor device, since the insulating films are formed L-shaped, it is possible to reduce an area at which the insulating films make contact with the raised source and drain layers when the raised source and drain layers are formed by selective epitaxial growth. This prevents formation of facets, resulting in improving fabrication yield of a semiconductor device.

7 Claims, 4 Drawing Sheets

SEMICONDUCTOR DEVICE HAVING RAISED SOURCE-DRAINS AND METHOD OF FABRICATING THE SAME

BACKGROUND OF THE INVENTION

1. Field of the Invention

The invention relates to a semiconductor device and a method of fabricating the same, and more particularly to MOS-FET including raised source and drain layers and a particular shaped insulating film formed on a sidewall of a gate electrode, and a method of fabricating the same.

2. Description of the Related Art

Fabrication of a transistor in a smaller size is absolutely necessary for operating a MOS integrated circuit at higher speed and densifying MOS integrated circuit. However, formation of a MOS transistor in a smaller size is accompanied with problems such as short channel effect and punch-through.

To solve those problems, Japanese Unexamined Patent Publication No. 2-222153, based on U.S. patent application Ser. No. 289,346 filed on Dec. 22, 1988 by Mark S. Rodder et al. and assigned to Texas Instrument Incorporated, has suggested a method of forming raised source and drain layers on a silicon substrate. The suggested method is explained hereinbelow with reference to FIGS. 1A to 1C.

As illustrated in FIG. 1A, local oxidation is carried out on a silicon substrate 1A to thereby form device isolation layers 2 for defining device formation regions therebetween. Then, n- or p-type impurities are ion-implanted into the p- or n-type silicon substrate 1A at a depth of a couple of micrometers ($\mu$m), followed by rapid thermal annealing (RTA) at about 850 degrees centigrade for activation of the impurities. Thus, a well region 1B is formed. After impurities have been implanted for controlling a threshold value of a transistor, a gate oxide film 3 is formed on the silicon substrate 1A by 5 nm, and a polysilicon film which will later make a gate electrode 4 is deposited on the gate oxide film 3 by 200 nm, and further an oxide film is deposited on the polysilicon film by 50 nm. Then, the gate oxide film, the polysilicon film and the oxide film are patterned to thereby form the gate electrode 4 on the gate oxide film 3, and the oxide film 5A on the gate electrode 4. Then, a nitride film is deposited over a resultant by 20 nm, followed by plasma etching to remove unnecessary portions of the nitride film and form a first gate electrode sidewall 16A.

Then, as illustrated in FIG. 1B, a resultant is treated with vapor of hydrofluoric acid to thereby remove natural oxide films formed on regions of the silicon substrate 1A where source and drain regions are later to be formed. Then, a resultant is introduced without exposing to atmosphere into an apparatus for accomplishing a low pressure chemical vapor deposition (LPCVD), in which selective epitaxial growth is accomplished at about 800 degrees centigrade on regions of the silicon substrate 1A where silicon is exposed, employing dichlorosilane ($SiCl_2H_2$) as a source gas which is mixed with hydrogen chloride (HCl) gas under a condition that a silicon film is not formed on the silicon oxide films 2 and 5A. As a result, there are formed raised source and drain layers 7A between the device isolation layers 2 and the first gate electrode sidewalls 16A. There are formed gaps between the first gate electrode sidewalls 16A and facets 8A and 8B of the raised source and drain regions 7A. Herein, the facets 8A and 8B are inclined portions of the raised source and drain layers 7A at which the raised source and drain layers 7A do not make close contact with the first gate electrode sidewalls 16A. Thus, it is necessary to form second sidewalls over the first gate electrode sidewalls 16A in order to fill the thus formed gaps therewith. The facet 8A is a plane having Miller indices (111), whereas the facet 8B is a plane having high Miller indices such as (311) and (511).

An oxide film is deposited over a resultant by about 40 nm. Then, the thus deposited oxide film is plasma-etched so that a portion thereof making contact the first gate electrode sidewall 16A remains unetched and the rest thereof is removed. Thus, there are formed second gate electrode sidewalls 16B entirely covering the facets 8A and partially covering the facets 8B therewith.

Then, after the oxide film 5A located on the gate electrode 4 is removed, the gate electrode 4 is oxidized at an exposed surface thereof to thereby form a thin film having a depth of about 5 nm. This film prevents the gate electrode 4 and source/drain regions from being contaminated by ion implantation to be carried out in a next step. Then, $BF_2$ is ion-implanted into the raised source and drain layers 7A at 10–20 KeV when the raised source and drain layers 7A is p-type, or As is ion-implanted into the raised source and drain layers 7A at 40–60 KeV when the raised source and drain layers 7A is n-type, followed by RTA at about 1000 degrees centigrade to thereby diffuse and activate the impurities into the silicon substrate 1A and the gate electrode 4. Thus, there are formed source and drain diffusion layers 9 in the silicon substrate 1A.

As illustrated in FIG. 1C, after the thin film for prevention of the gate electrode 4 and source/drain regions from contamination due to the ion-implantation is removed, titanium is sputtered over a resultant by about 40 nm, followed by RTA at about 700 degrees centigrade to thereby form a titanium silicide ($TiSi2$) layer 10 (indicated with reference numerals 10A and 10B in FIG. 1C) on the raised source and drain layers 7A and the gate electrode 4. The thus formed titanium silicide 10 has a relatively high resistance. Then, unnecessary layers which have been formed at the same time when the titanium silicide layer 10 has been formed, such as titanium nitride and extra titanium, are selectively removed by etching, followed by RTA at about 850 degrees centigrade to thereby make the titanium silicide layer 10 lower in resistance. Thus, there are formed low-resistive titanium silicide layers 10A and 10B, and the silicidation process is completed.

Then, an interlayer insulating film 11 is deposited over a resultant at low temperature by plasma enhanced CVD. Contact holes 12 are formed leading to the titanium silicide layers 10A and 10B and hence the source and drain layers 9. Then, aluminum electrodes 13 are formed filling the contact holes 12 therewith. Thus, there is completed a MOS transistor.

As illustrated in FIG. 1B, a junction depth X of source and drain diffusion layers is defined as a depth from an upper surface of a channel formation region to pn junction. Accordingly, a transistor having raised source and drain diffusion layers such as those indicated with reference numeral 7A can have a shallower junction depth by a thickness of raised source and drain layers than a transistor having no raised source and drain layers. Namely, the formation of raised source and drain layers provides an advantage that a shallow diffusion layer is able to be readily formed.

For instance, when a diffusion layer having a depth of 100 nm is to be formed by introduction of impurities due to ion-implantation and activation by RTA, if raised source and drain layers are formed by a 50 nm thickness, it is allowed for the diffusion layer to have just a depth of 50 nm. Hence, it is possible to form a diffusion layer suitable for a fine MOS transistor of 0.25 µm design rule or smaller. In addition, it is also possible to prevent sheet and contact resistance of source and drain regions from becoming higher in dependence on a thickness of raised source and drain layers.

As mentioned earlier with reference to FIG. 1C, when the raised source and drain layers 7A are formed by selective growth of silicon films, there may be formed the facets 8A and 8B at which the raised source and drain layers 7A do not make close contact with the first gate electrode sidewalls 16A. Since the diffusion layers 9 are formed by ion-implantation after the second gate electrode sidewalls 16B have been formed, a junction depth of the diffusion layers 9 is influenced by the facets 8A and 8B of the second gate electrode sidewalls.

The reason why the facets 8A and 8B are formed while the selective growth of the silicon films is that silicon atoms existing at an outer surface of silicon films move to a plane having smaller free energy so that free energy of entirety of the silicon films is minimized. It is said that (100), (110), (311) and (111) planes of a silicon dioxide film (or a silicon nitride film) have free energy smaller in this order. With a greater thickness of the raised source and drain layers 7A, silicon atoms are diffused from the first gate electrode sidewalls 16A to a surface of the raised source and drain layers 7A having smaller free energy to thereby form planes having smaller free energy, such as a (111) plane. Namely, the raised source and drain layers 7A grow so that a film which will make contact with the first gate electrode sidewalls 16A has a minimum thickness and thus the raised source and drain layers 7A have minimum free energy, and as a result there are formed facets such as those indicated with reference numerals 8A and 8B.

Once facets have started to be formed, resultant facets have a shape determined in accordance with growth rate of each of facets. In the above mentioned case, since a (311) plane has smaller growth rate than other planes, if a (311) plane has once started to be formed, the (311) plane continues to expand, and as a result, a resultant facet horizontally expands.

For instance, if a facet has only (111) planes like the facet 8A illustrated in FIG. 1B, the facet makes an angle of about 15 degrees with the first gate electrode sidewalls 16A. Hence, if the raised source and drain layers 7A are designed to have a thickness of about 60 nm, a gap to be formed between the first gate electrode sidewall 16A and the facet 8A is about 16 nm in width (60 nm×sin 15°≈16 nm). Thus, it is relatively easy to completely fill the gap with an insulating film such as the second gate electrode sidewalls 16B. However, most of the cases, there is formed a (311) or (511) plane, in which case the gap formed between the first gate electrode sidewalls 16A and the facet 8A has a width of about 100 nm. Thus, if the gap is completely filled with an insulating film such as the second gate electrode sidewalls 16B, there would be accompanied a problem of generation of parasitic resistance below the first gate electrode sidewalls 16A. This makes a MOS transistor away from practical use.

On the other hand, if only a plane (111) is to be covered with the second gate electrode sidewalls 16B, there would be accompanied a problem that shapes of (311) and (511) planes would exert harmful influence on junction depth of a diffusion layer.

Japanese Unexamined Patent Publication No. 5-182981 has suggested a method of controlling a shape of a facet which makes contact with a first gate electrode sidewalls. In the suggested method, as illustrated in FIG. 2, a first gate electrode sidewall 16C is designed to have a reverse tapered shape. Raised source and drain layers 7B are formed by selective epitaxial growth so that the raised source and drain layers 7B make close contact with the first gate electrode sidewalls 16C without a gap therebetween.

However, when a fine MOS transistor is to be fabricated, it would be quite difficult or almost impossible to form a sidewall with high accuracy such as the first gate electrode sidewall 16C having a reverse tapered shape.

As having been explained so far, it is impossible to completely control a shape of facets in accordance with conventional methods of fabricating a semiconductor device. As a result, a shape of facets has large dispersion that exerts remarkable influence on junction depth of a diffusion layer, resulting in problems of reduction in a fabrication yield and lack of stability in performances of a resultant MOS transistor.

K. Weldon et al. has suggested novel raised source and drain structures which have been fabricated using selective silicon deposition (SSD). According to Abstract No. 478 having been described by them, significant improvements in narrow line salicide formation and salicide-silicon interfacial resistance have been made, and functional 0.40 µm CMOS SRAM devices were fabricated with SSD vs. non-SSD splits showing comparable yield.

SUMMARY OF THE INVENTION

It is an object of the present invention to provide a semiconductor device and a method of fabricating the same both of which make it possible to control diffusion of impurities from raised source and drain layers to thereby reduce dispersion in regions where diffusion layers are formed, and as a result ensure more stable performances of a semiconductor device and enhance a fabrication yield.

In one aspect, there is provided a semiconductor device including (a) a semiconductor substrate, (b) a gate insulating film formed on the semiconductor substrate, (c) a gate electrode formed on the gate insulating film, (d) insulating films formed on a sidewall of the gate electrode, each of the insulating films being L-shaped, and (e) raised source and drain layers formed on the semiconductor substrate in selected areas so that the raised source and drain layers make contact with a part of the insulating films.

There is further provided a semiconductor device including (a) a semiconductor substrate, (b) a gate insulating film formed on the semiconductor substrate, (c) a gate electrode formed on the gate insulating film, (d) insulating films each comprising a first portion vertically extending on a sidewall of the gate electrode, and a second portion horizontally extending on the semiconductor substrate, and (e) raised source and drain layers formed on the semiconductor substrate in selected areas so that the raised source and drain layers make contact only with an end surface of the second portion.

It is preferable that the raised source and drain layers make contact with an upper surface of the second portion as well as with an end surface of the second portion. It is in particular preferable that the raised source and drain layers make contact with only a part of the upper surface of the second portion.

In another aspect, there is provided a method of fabricating a semiconductor device, including the steps of (a) forming a gate insulating film on a semiconductor substrate, (b) forming a gate electrode on the gate insulating film, (c) forming first and second insulating films on a sidewall of the gate electrode, the first insulating film being L-shaped and the second insulating film covering the first insulating film therewith, (d) removing the second insulating film, (e) forming raised source and drain layers on the semiconductor substrate in selected areas so that the raised source and drain layers make contact with a part of the first insulating layer, and (f) implanting impurities into the raised source and drain layers, followed by thermal annealing to form source and drain diffusion layers in the semiconductor substrate.

There is further provided a method of fabricating a semiconductor device, including the steps of (a) forming a gate insulating film on a semiconductor substrate, (b) forming a gate electrode on the gate insulating film, (c) forming first and second insulating films, the first insulating film comprising a first portion vertically extending on a sidewall of the gate electrode and a second portion horizontally extending on the semiconductor substrate, the second insulating film covering the first insulating film therewith, (d) removing the second insulating film, (e) forming raised source and drain layers on the semiconductor substrate in selected areas so that the raised source and drain layers make contact with an end surface of the second portion, and (f) implanting impurities into the raised source and drain layers, followed by thermal annealing to form source and drain diffusion layers in the semiconductor substrate.

It is preferable that the raised source and drain layers are formed in the step (e) so that they make contact with an upper surface of the second portion as well as with an end surface of the second portion. The raised source and drain layers may be formed so that they make contact with only a part of the upper surface of the second portion.

For instance, the first insulating film may be made of silicon nitride, in which case, the second insulating film may be designed to have a great etching selection ratio to the first insulating film.

There is still further provided a method of fabricating a semiconductor device, including the steps of (a) forming a gate insulating film on a semiconductor substrate, (b) forming a gate electrode on the gate insulating film, (c) forming first and second insulating, the first insulating film comprising a vertically extending portion formed on a sidewall of the gate electrode and a horizontally extending portion formed on the semiconductor substrate, the second insulating film covering the first insulating film therewith, (d) removing the second insulating film, (e) forming a silicon film so that an amorphous silicon film is formed on the first insulating film and a crystal silicon film is formed on the semiconductor substrate, a resultant having an oblique facet at an end surface of the horizontally extending portion between the amorphous silicon film and the crystal silicon film; (f) implanting impurities into the crystal silicon film, (g) crystallizing a part of the amorphous silicon film so that a facet between the amorphous silicon film and the crystal silicon film transfers onto an upper surface of the horizontally extending portion, (h) removing the amorphous silicon film, and (i) diffusing the impurities into the semiconductor substrate located below the crystal silicon film to form source and drain diffusion layers.

In the above mentioned semiconductor device, since the insulating films are formed L-shaped, it is possible to reduce an area at which the insulating films make contact with the raised source and drain layers when the raised source and drain layers are formed by selective epitaxial growth. This prevents formation of facets, resulting in improving fabrication yield of a semiconductor device and ensuring more stable performances of a semiconductor device.

When the raised source and drain layers are to be formed by solid phase epitaxial growth, bottom surfaces of the L-shaped insulating films prevent diffusion of impurities, and hence it is possible to form source and drain diffusion layers regardless of facet shapes.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 3A:
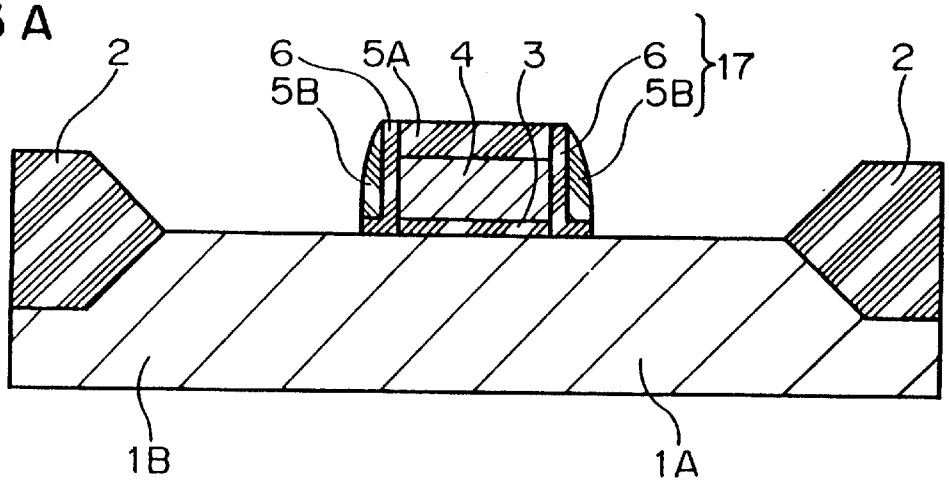
FIGS. 3A to 3C are cross-sectional views of a semiconductor device, illustrating respective steps of a method in accordance with the first embodiment of the present invention.

A method of fabricating a semiconductor device in accordance with the first embodiment is explained hereinbelow with reference to FIGS. 3A to 3B. As illustrated in FIG. 3A, local oxidation is carried out on a silicon substrate 1A to thereby form device isolation layers 2 for defining device formation regions therebetween. Then, n- or p-type impurities are ion-implanted into the p- or n-type silicon substrate 1A, followed by rapid thermal annealing (RTA) at about 850 degrees centigrade for activation of the implanted impurities and recovery of crystal defects. After implantation of impurities for controlling a threshold value of a transistor, there is formed a well region 1B in the silicon substrate 1A. Then, a gate oxide film 3 is formed on the silicon substrate 1A by 5 nm, and a polysilicon film which will later make a gate electrode 4 is deposited on the gate oxide film 3 by 150 nm, and further a silicon dioxide film is deposited on the polysilicon film by 100 nm.

Then, a photoresist film is deposited on a resultant and patterned by photolithography into a gate electrode pattern. Then, the gate oxide film, the polysilicon film and the silicon dioxide film are etched to thereby form the gate electrode 4 on the gate oxide film 3, and the oxide film 5A on the gate electrode 4. Hereinafter, the photoresist film is removed. Then, a silicon nitride film 6 as the first insulating film is deposited over a resultant by 5 nm, and then an oxide film 5B as the second insulating film is deposited over the silicon nitride film 6. Then, plasma etching is carried out so that a portion of the films 6 and 5B formed on a side surface of the gate electrode remains unetched and the rest of the films 6 and 5B are removed. Thus, there is formed a sidewall 17 comprising the silicon nitride film 6 and the oxide film 5B on a side surface of the gate electrode 4.

Figure 3B:
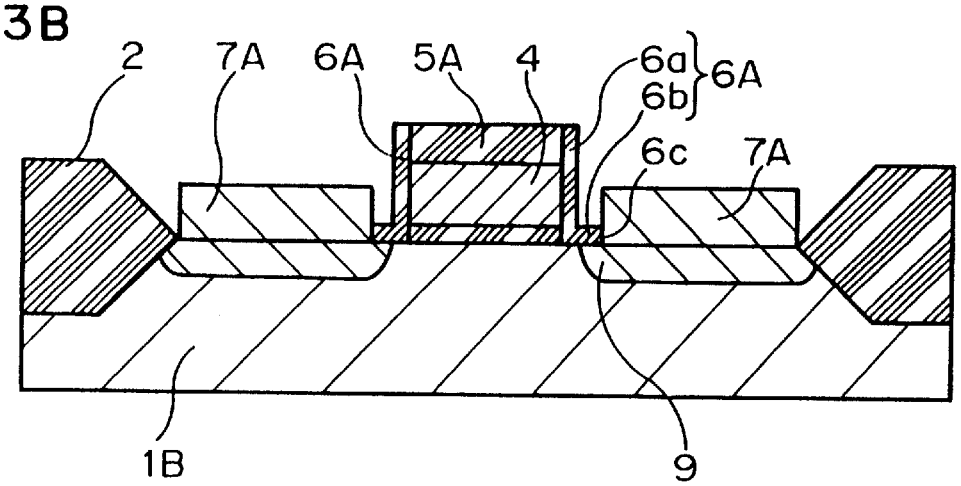

Then, as illustrated in FIG. 3B, only the oxide film 5B of the sidewall 17 is selectively removed by hydrofluoric acid to thereby form a L-shaped gate electrode sidewall 6A made of silicon nitride. The thus formed L-shaped gate electrode sidewall 6A includes a first portion 6a vertically extending on a side surfaces of the gate oxide film 3, the gate electrode 4 and the oxide film 5A, and a second portion 6b horizontally extending on the semiconductor substrate 1A. The second portion 6b is shorter in length than the first portion 6a.

Then, a resultant is treated with vapor of hydrofluoric acid to thereby remove natural oxide films formed on regions of the silicon substrate 1A where source and drain regions are later to be formed. Then, a resultant is introduced without exposing to atmosphere into an apparatus for accomplishing a low pressure chemical vapor deposition (LPCVD), in which selective epitaxial growth is accomplished at about 800 degrees centigrade on regions of the silicon substrate 1A where silicon is exposed, employing dichlorosilane ($SiCl_2H_2$) gas as a source gas which is mixed with hydrogen chloride (HCl) gas under a condition that a silicon film is not formed on the silicon oxide films 2 and 5A. As a result, there are formed raised source and drain layers 7A between the device isolation layers 2 and the L-shaped gate electrode sidewalls 6A.

The thus raised source and drain layers 7A make contact with the L-shaped gate electrode sidewalls 6A through end surfaces 6c of the second portions 6b of the L-shaped gate electrode sidewalls 6A. The end surfaces 6c of the second portions 6b have just a small height, which is specifically about 5 nm. Hence, there is quite small probability of forming facets on a surface of the raised source and drain layers 7A. A portion of the raised source and drain layers 7A exceeding 5 nm in a thickness does not make contact with the end surface 6c of the second portion 6b of the L-shaped gate electrode sidewalls 6A, and hence it is possible to prevent free energy from increasing. Thus, when the raised source and drain layers 7A are designed to have a thickness of about 50 1nm, only (110) and/or (111) planes are formed, and (311) and (511) planes are prevented from being formed.

Figure 1A:
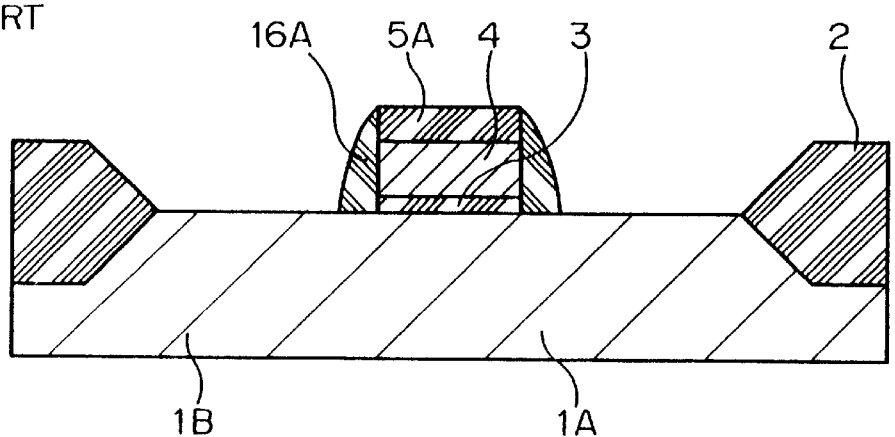
FIGS. 1A to 1C are cross-sectional views of a semiconductor device, illustrating respective steps of a conventional method of fabricating the same.
Figure 1B:
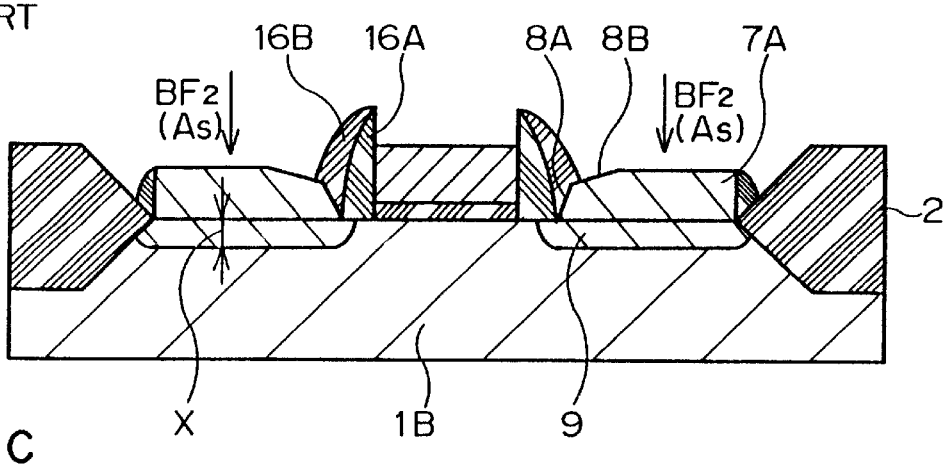
Figure 1C:
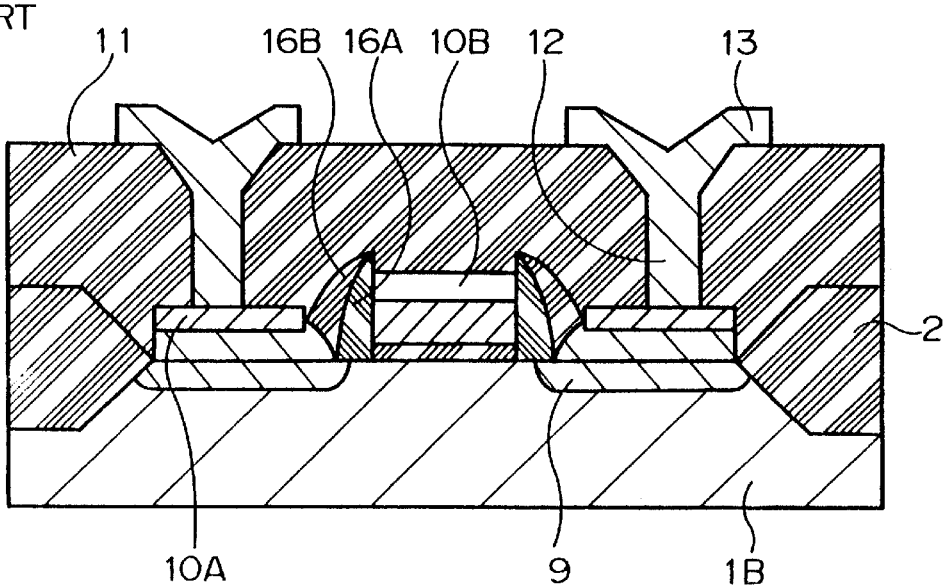
Figure 2:
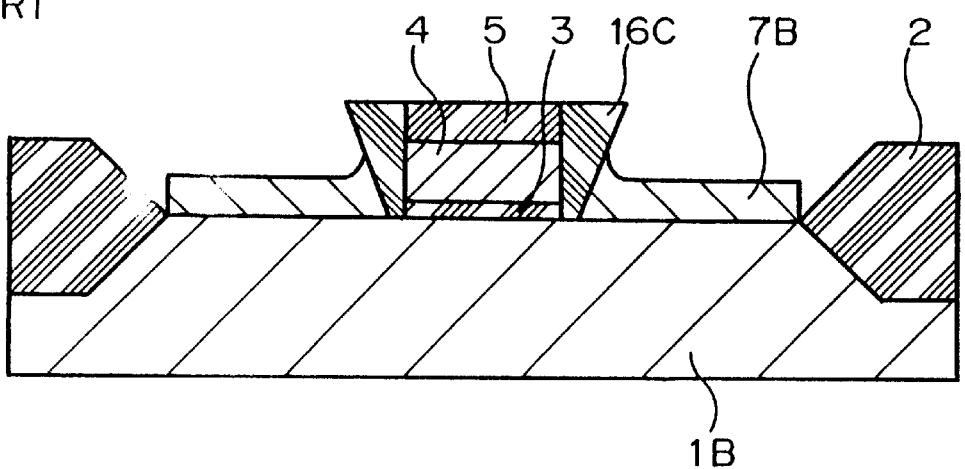
FIG. 2 is a cross-sectional view of a semiconductor device fabricated in accordance with another conventional method.
Figure 3C:
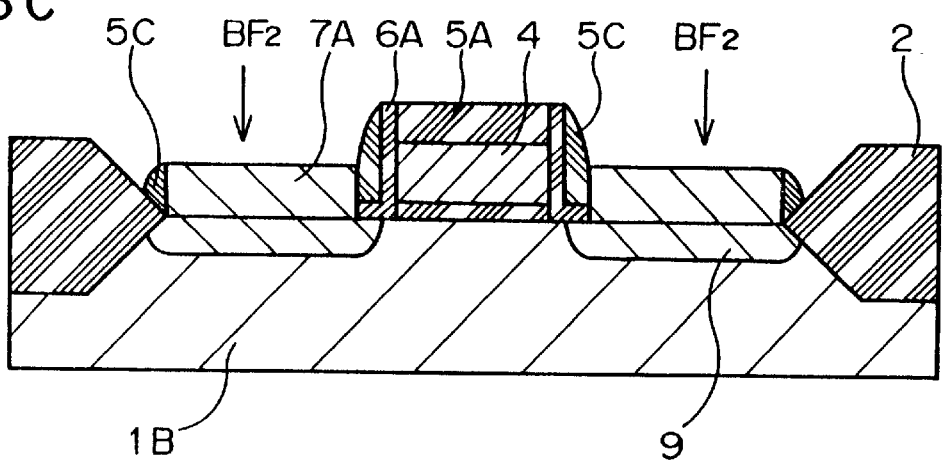

Then, as illustrated in FIG. 3C, after an oxide film has been deposited over a resultant, the oxide film is plasma-etched to thereby form a second gate electrode sidewall 5C by about 20 nm covering the first gate electrode sidewall 6A. Thus, a space formed between the first portion 6a of the L-shaped gate electrode sidewall 6A and the raised source and drain layers 7A are filled with the second gate electrode sidewall 5C. Then, the raised source and drain layers 7A are implanted at 20 KeV with doses of $2 \times 10^{15}$ atoms/cm$^2$ $BF_2$, followed by RTA at about 1000° C. to thereby activate boron (B) and at the same time diffuse boron into the underlying silicon substrate 1A. Thus, there are formed source and drain layers 9. Hereinafter, though not illustrated, the same steps as those in a conventional method having been described with reference to FIG. 1C are carried out to thereby complete a MOS transistor.

In accordance with the above mentioned first embodiment, the thin L-shaped gate electrode sidewalls 6A ensures the formation of the raised source and drain layers 7A with no planes which have facets having high Miller indices such as (311) and (511). Accordingly, it is possible to form the source and drain diffusion layers 9 having an accurately controlled junction depth, which ensures an enhanced fabrication yield of a fine MOS transistor having stable performances.

A method of fabricating a semiconductor device in accordance with the second embodiment is explained hereinbelow with reference to FIGS. 4A and 4B.

Figure 4A:
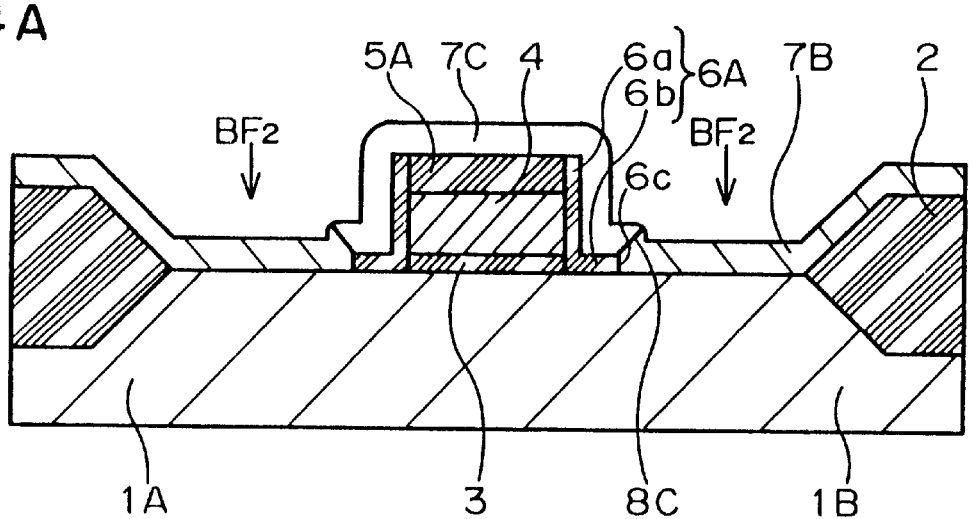
FIGS. 4A and 4B are cross-sectional views of a semiconductor device, illustrating respective steps of a method in accordance with the second embodiment of the present invention.
Figure 4B:
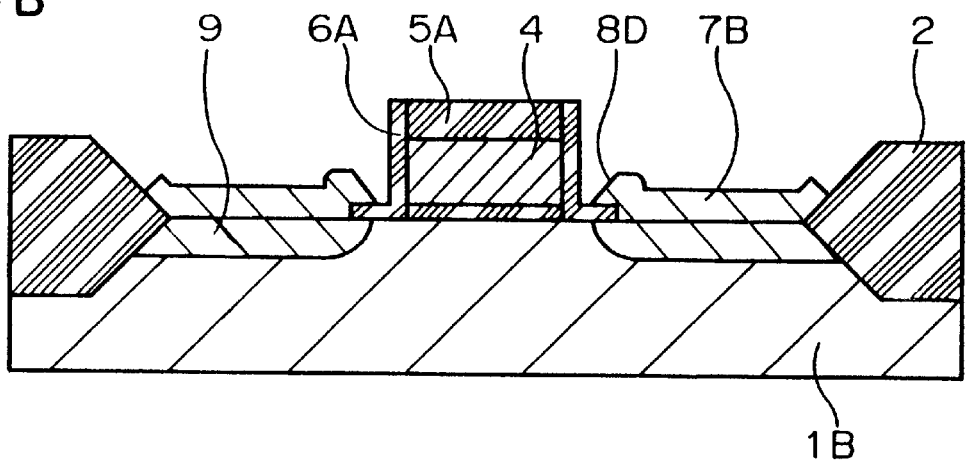

First, as illustrated in FIG. 4A, there are formed the device isolation regions 2, the well region 1B, the gate oxide film 3, the gate electrode 4, the oxide film 5A, and the L-shaped gate electrode sidewall 6A are formed in or on the silicon substrate 1A in the same manner as the first embodiment.

After the formation of the L-shaped gate electrode sidewall 6A, a resultant is treated with vapor of hydrofluoric acid to thereby remove natural oxide films formed on regions of the silicon substrate 1A where source and drain regions are later to be formed. Then, a resultant is introduced without exposing to atmosphere into an apparatus for accomplishing LPCVD, in which silicon is made grown by about 40 nm, employing disilane ($Si_2H_6$) gas as a source gas under a condition that an amorphous silicon film is formed on the insulating films 5A and 6A.

Epitaxial growth is found on a surface of the silicon substrate 1A, namely there are formed crystal silicon films 7B both on the silicon substrate 1A and the device isolation regions 2. In contrast, there is formed an amorphous silicon film 7C on the insulating films 5A and 6A. In the second embodiment, there are formed facets 8C separating the amorphous silicon film 7C and the crystal silicon film 7B from each other. As seen in FIG. 4A, each of the facets 8C starts at upper edges of the end surface 6c of the second portion 6b of the L-shaped gate electrode sidewall 6A, and obliquely, upwardly extends.

Then, the raised source and drain layers 7B are implanted at 10 KeV with doses of $3 \times 10^{15}$ atoms/cm$^2$ $BF_2$, followed by RTA at 550° C. to thereby make the raised source and drain layers 7B horizontally grow toward the first portion 6a with the silicon substrate 1A being used as a seed. Thus, the amorphous silicon film 7C is partially crystallized. The horizontal growth of the raised source and drain layers 7B is accomplished so that new facets 8D for separating the amorphous silicon film 7C from the crystal silicon films 7B are located second portions 6b of the L-shaped gate electrode sidewalls 6A, as illustrated in FIG. 4B.

Then, after the amorphous silicon film 7C is removed by a mixture solution containing hydrofluoric acid, sulfuric acid and acetic acid, RTA is carried out in order to diffuse boron (B) into the underlying silicon substrate 1A and at the same time activate boron. Thus, there are formed source and drain layers 9 in the silicon substrate 1A. Hereinafter, though not illustrated, the same steps as steps in a conventional method such as the formation of the second gate electrode sidewall, the formation of an interlayer insulating film, the formation of contact holes, and arrangement of aluminum wires are carried out to thereby complete a MOS transistor.

In accordance with the above-mentioned second embodiment, the second portion 6b making contact with the silicon substrate 1A prevents diffusion of impurities therethrough. Thus, a distance between a side surface of the gate electrode 4 to the diffusion layer 9 is not dependent on a shape of the facet 8D, but dependent only on a length of the second portion 6b of the L-shaped gate electrode sidewall 6A. As a result, it is possible to form diffusion layers which are not influenced by a shape of gate ends of the raised source and drain layers 7B.

The reason why the first insulating film is made of silicon nitride in the above mentioned first and second embodiments is that the methods of the first and second embodiments include steps of removing natural oxide films by vapor of hydrofluoric acid and removing the amorphous silicon film by the mixture solution including hydrofluoric acid, before the raised source and drain layers 7A and 7B are formed by CVD. Though the second insulating film is made of an oxide film in the first and second embodiments, there may be used any film as the second insulating film unless it has film has a great etching selection ratio to the first insulating film. For instance, there may be used PSG film or BPSG film as the second insulating film.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-167681 filed on Jun. 27, 1996 including specification, claims, drawings and summary is incorporated herein by reference in its entirety.

What is claimed is:

1. A semiconductor device comprising:
   (a) a semiconductor substrate;
   (b) a gate insulating film formed on said semiconductor substrate;
   (c) a gate electrode formed on said gate insulating film;
   (d) insulating films formed on a sidewall of said gate electrode, each of said insulating films being L-shaped wherein said L-shaped insulating film makes contact with an end facet of said gate insulating film;
   (e) raised source and drain layers formed on said semiconductor substrate in selected areas so that said raised source and drain layers make contact with a part of said insulating films, said raised source and drain layers having a side surface and a top surface; and
   (f) a second insulating film formed on said insulating film, said second insulating film being in contact with said side surface of said raised source and drain layers, wherein said side surface is one of a (110) plane and a (111) plane.

2. The semiconductor device as set forth in claim 1, wherein said sidewall insulating films are made of silicon nitride.

3. A semiconductor device comprising:
   (a) a semiconductor substrate;
   (b) a gate insulating film formed on said semiconductor substrate;
   (c) a gate electrode formed on said gate insulating film;
   (d) L-shaped insulating films each comprising a first portion vertically extending on a sidewall of said gate electrode, and a second portion horizontally extending on said semiconductor substrate wherein said L-shaped insulating film makes contact with an end facet of said gate insulating film;
   (e) raised source and drain layers formed on said semiconductor substrate in selected areas so that said raised source and drain layers make contact only with an end surface of said second portion, said raised source and drain layers having a side surface and a top surface; and
   (f) a second insulating film formed on said L-shaped insulating film, said second insulating film being in contact with said side surface of said raised source and drain layers, wherein said side surface is one of a (110) plane and a (111) plane.

4. The semiconductor device as set forth in claim 3, wherein said sidewall insulating films are made of silicon nitride.

5. The semiconductor device as set forth in claim 3, wherein said second portion has a thickness of not more than 5 nm.

6. A semiconductor device comprising:
   (a) a semiconductor substrate;
   (b) a gate insulating film formed on said semiconductor substrate;
   (c) a gate electrode formed on said gate insulating film;
   (d) L-shaped insulating films each comprising a first portion vertically extending on a sidewall of said gate electrode, and a second portion horizontally extending on said semiconductor substrate;
   (e) raised source and drain layers formed on said semiconductor substrate in selected areas so that said raised source and drain layers make contact with an upper surface and an end surface of said second portion, said raised source and drain layers having an obliquely slanted side surface and a horizontal top surface; and
   (f) a second insulating film formed on said L-shaped insulating film, said second insulating film being in contact with said side surface of said raised source and drain layers.

7. The semiconductor device as set forth in claim 6, wherein said raised source and drain layers make contact with only a part of said upper surface of said second portion.

* * * * *